Sept. 15, 1953

J. H. GUYTON 2,652,486

SIGNAL SEEKING TUNER

Filed July 22, 1949

2 Sheets-Sheet 1

Inventor

James H. Guyton

By

Spencer, Willits, Helwig & Baillio

Attorneys

Sept. 15, 1953 J. H. GUYTON 2,652,486

SIGNAL SEEKING TUNER

Filed July 22, 1949 2 Sheets-Sheet 2

Inventor
James H. Guyton

By
Spencer, Willits, Helwig & Baillio
Attorneys

Patented Sept. 15, 1953

2,652,486

UNITED STATES PATENT OFFICE 2,652,486

SIGNAL SEEKING TUNER

James H. Guyton, Kokomo, Ind., assignor to General Motors Corporation, Detroit, Mich., a corporation of Delaware Application July 22, 1949, Serial No. 106,223

5 Claims. (Cl. 250—20)

This invention relates to signal or control voltage developing means and more specifically to means for developing a signal or control voltage of substantially constant value for operating or control purposes, which is derived originally from an input which may vary widely in strength. The derivation of a control signal which has substantially constant value, if it is present at all, from an input signal which may have wide variation in amplitude will obviously have numerous fields of application.

As illustrative of a valuable use for the same, there may be mentioned automatic radio control or tuning where the radio receiver is indexed to tune in a desired station by the incoming signal from the station itself. In these tuning systems some driving means is provided to cause the tuner to scan the frequency band and when a transmitted signal is tuned in a control voltage is applied to means to deenergize the driving means and the receiver stops on that station. Tuners of this type have been referred to as signal actuated tuners or signal seeking tuners. A transmitted signal in the general frequency band is relatively narrow on either side of the allocated frequency of the station and, therefore, the response curve for any station will be narrow, and in order to have the tuning apparatus stop before it has passed beyond the tuned-in portion, the control means must be triggered ahead of the resonant peak and have a small enough amount of inertia to stop quickly. In this type of control, the control voltage applied to the tuner has, of course, varied in strength, depending upon the strength of the incoming signal. If the station being tuned in was powerful and local, then a strong control voltage would be applied to stop the driving means, but if a weak distant signal was tuned in, then only a weak control voltage would be available, and perhaps not apply the stopping force quickly enough to stop the drive before the station had been passed. Furthermore, the variation in the strength of the control voltage would cause the tuner to stop at different relative positions on the resonant curve for the different strengths. To be able to apply a control voltage or signal of constant strength and constant frequency selectivity to the tuning system, independent of any variation in the strength of the transmitted incoming signal, as long as it was above a prescribed threshold value, would remove inaccuracies in tuning.

It is, therefore, an object of my invention to provide means for obtaining a control voltage of substantially constant strength and frequency selectivity from an input signal of varying strength.

It is a further object of my invention to provide a control voltage or signal for an utomatic tuning means which, if it is above a threshold value, will be substantially constant, irrespective of any variation in the input signal to the set.

It is a further object of my invention to provide an automatic signal actuated radio tuning means which will accurately stop at a predetermined point on the resonant curve regardless of the strength of the incoming control signal.

With these and other objects in view which will become apparent as the specification proceeds, my invention will be best understood by reference to the following specification and claims and the illustrations in the accompanying drawings, in which:

Figure 4A:
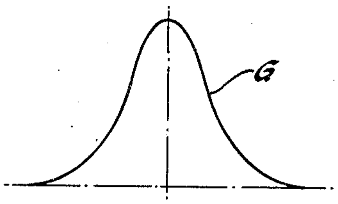
Figure 4 is a simplified circuit diagram to illustrate one of the basic principles of my invention.
Figure 4:
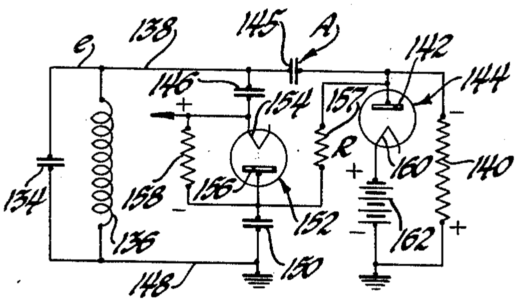
Figure 4B:
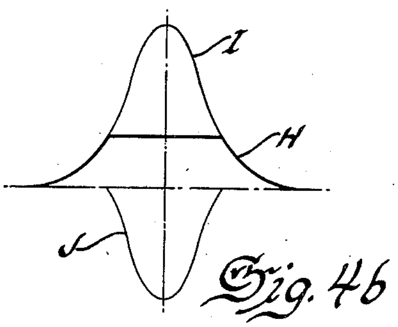

Figures 4*a* and 4*b* are response curves illustrating the voltage appearing at certain locations in Figure 4.

Figure 5A:
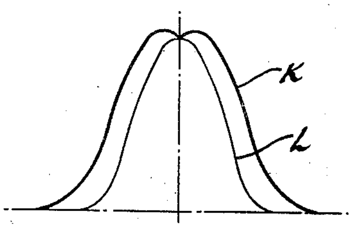
Figure 5:
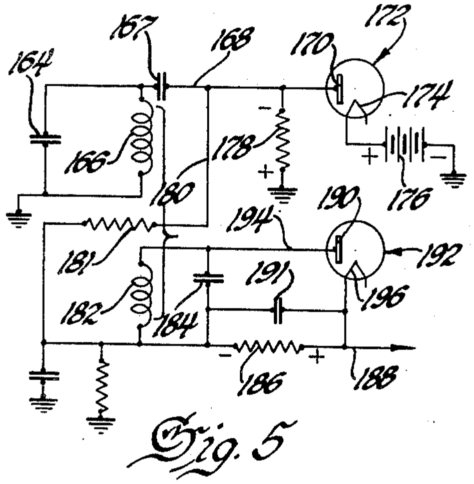
Figure 5B:
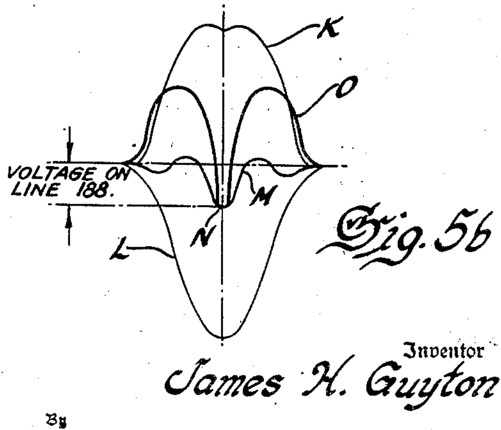

Figure 5 is a further simplified circuit diagram illustrating additional principles of my invention; and Figures 5*a* and 5*b* are response curves illustrating voltages appearing in the circuit of Figure 5.

Figure 1:
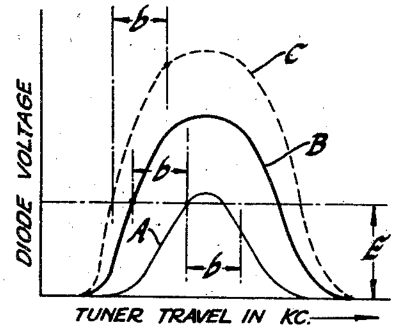
Figure 1 is a graph of a series of response curves in a radio receiver.

Referring now more specifically to Figure 1, as mentioned previously herein, with the signal seeking type of tuner in which some means is used to drive the tuning means so that the receiver scans the band, as an incoming signal is tuned in and passed a certain response voltage occurs in the system. Figure 1 illustrates typical response curves of diode detector voltage in the second detector of a superheterodyne receiver as the tuner moves across the band, and in this figure curve A shows the response of a station which barely has a sufficient amount of signal to trip the tuner, assuming that it is adjusted so that it will not stop on any station having a voltage less than E. The peak of curve A rises only slightly above the value E, but this will trip the tuner. Given a certain physical tuner which has a fixed amount of inertia and also certain speed of the control relays, it will be evident that the time of stopping will be relatively constant for that given system and in this case let it be assumed that that time constant or coast is represented by the distance *b*. Applying this distance to curve A, it is noted that the tuner will come to rest approximately half way down the back portion of the resonance curve, well past the peak.

Assuming now that the incoming signal is strong enough to cause the normal AVC action in the receiver which tends to hold the signal to a substantially constant value, there will be obtained a response curve of the nature of B. The incoming signal in this instance may be some 10,000 times what the signal was in generating curve A, but the AVC action holds it down. Applying distance *b* to the second curve B, which is necessary to allow the apparatus to reach a halt, it is found that the tuner has stopped at a point slightly in advance of the peak of the resonance curve. This is assuming that the tuner speed is not so great in scanning the band but what the AVC action can take place in an attempt to hold down the signal.

Assuming further then that the tuner speed is faster, which most designers would prefer, and the AVC action is not permitted to apply its restraining force completely, then a response curve such as C shown in dotted lines will result, and again applying constant distance *b* for stopping, it is found that in this case the tuner would come to rest considerably prior to the peak of the resonance curve on the advance side. It will be obvious from the above explanation that with systems of this type the tuner may stop at any point from a point well in advance of the resonance peak to points as far as half way down the receding side, depending entirely upon the strength of the incoming wave. It would be a very great improvement if the exact point of stopping the tuner could be more accurately determined, regardless of the strength of the signal, and this problem has been solved by the circuits hereinafter described. It may be mentioned here that, while these circuits are described in combination with radio receiving circuits, it will be obvious that they have a much broader application, and that in any instance where it is desired to provide a constant strength control signal from an input which varies widely, they will apply.

Figure 2:
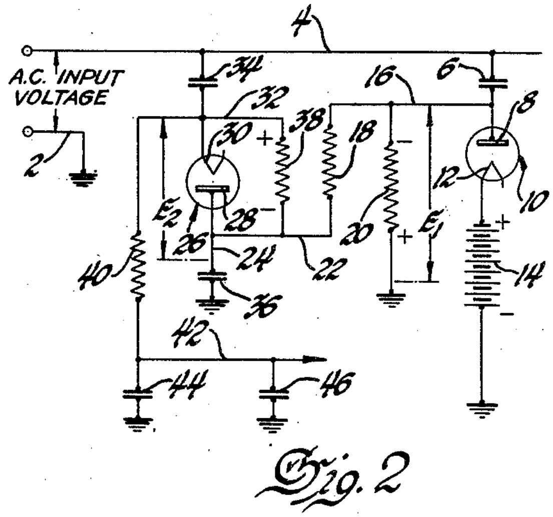
Figure 2 is a circuit diagram incorporating one of the principles of my invention.

Referring now to Figure 2, there is shown a partial circuit illustrating my invention. An A. C. input voltage is applied between ground terminal 2 and line 4. Condenser 6 has one terminal connected to input line 4 and the opposite terminal connected to electrode 8 of diode 10, the other electrode 12 of which is connected to the positive side of a battery 14, the negative side of which is grounded. A tie line 16 is connected between condenser 6 and electrode 8 and is connected to one end of a resistance 18 and also to one end of a resistance 20. The opposite terminal of resistance 18 is connected through line 22 to line 24. The diode 26 having one electrode 28 connected to line 24, has the other electrode 30 connected to a conductor 32, and also to a condenser 34, the opposite terminal of which is connected to input line 4. A condenser 36 is connected between line 24 and ground. A resistance 38 is connected between lines 22 and 32. Line 32 is also connected to a resistor 40, the opposite terminal of which is connected to connecting line 42, upon which the final control pulse is generated, and capacitors 44 and 46 are connected between line 42 and ground to form a filtering section.

Battery 14 is a biasing battery and its value is determined by the desired strength of the control voltage, which is to be provided. The polarity of the battery is indicated, the positive side being connected to the diode electrode, as is the polarity of the signal which is developed across resistance 20, having to do with the diode 10, the lower end having a higher positive potential. Resistance 38 is connected across the diode 26 and has its positive potential developed at the upper end. The voltage across resistor 20 will be defined as $E_1$ and the voltage across resistor 38 will be defined as $E_2$ said resistors being so selected as to give equivalent rectification efficiencies in cooperation with their associated condensers 6 and 34 respectively. Let it further be assumed that the radio frequency voltage impressed across lines 2—4 may be defined as *e*, and produces the rectified voltages $E_1$ and $E_2$ as indicated. The voltage $E_1$ will remain at zero until the value of $1.4e$ is greater than the voltage of the battery 14. When the peak value of the A. C. voltage exceeds the voltage value of the battery 14, then recitifier 10 will conduct and provide a voltage $E_1$ which will be equal to $1.4Ke-V$, where K is a constant equal to the efficiency of rectification and V is the voltage of the battery 14. At this same time $E_2$ will equal $1.4Ke$, assuming the efficiency of rectification of diode 26 is equal to that of diode 10 (equals K), inasmuch as it has impressed upon it exactly the same A. C. voltage as tube 10 in the reverse order, and is not biased by any battery. Since the two are applied in series relation and their output derived on line 42, the trigger voltage appearing on line 42 will be:

$$E_t=E_2-E_1$$

Substituting:

$$E_t=1.4Ke-(1.4Ke-V)$$

And clearing:

$$E_t=V$$

It is thus obvious that the voltage appearing on line 42, which is a triggering or control voltage, will, as long as the input voltage is large enough, be a voltage equal to the voltage of the biasing battery and will remain constant if the resistors are so selected as to give equivalent rectification efficiencies in the two diodes. Any fluctuation in the A. C. voltage *e* will be applied to the two diodes in opposition and will cancel out and, therefore, as soon as the peak value of the A. C. impressed voltage exceeds the voltage V, a control or trigger voltage will appear of the full value of the battery voltage and this will remain constant as long as an A. C. signal of sufficient strength exists. Thus a control voltage is obtained of constant value of the battery voltage irrespective of any variations in the impressed A. C. voltage and a trigger voltage of constant value is provided to trigger the tuner control system irrespective of any variations in the incoming transmitted signal.

Figure 3:
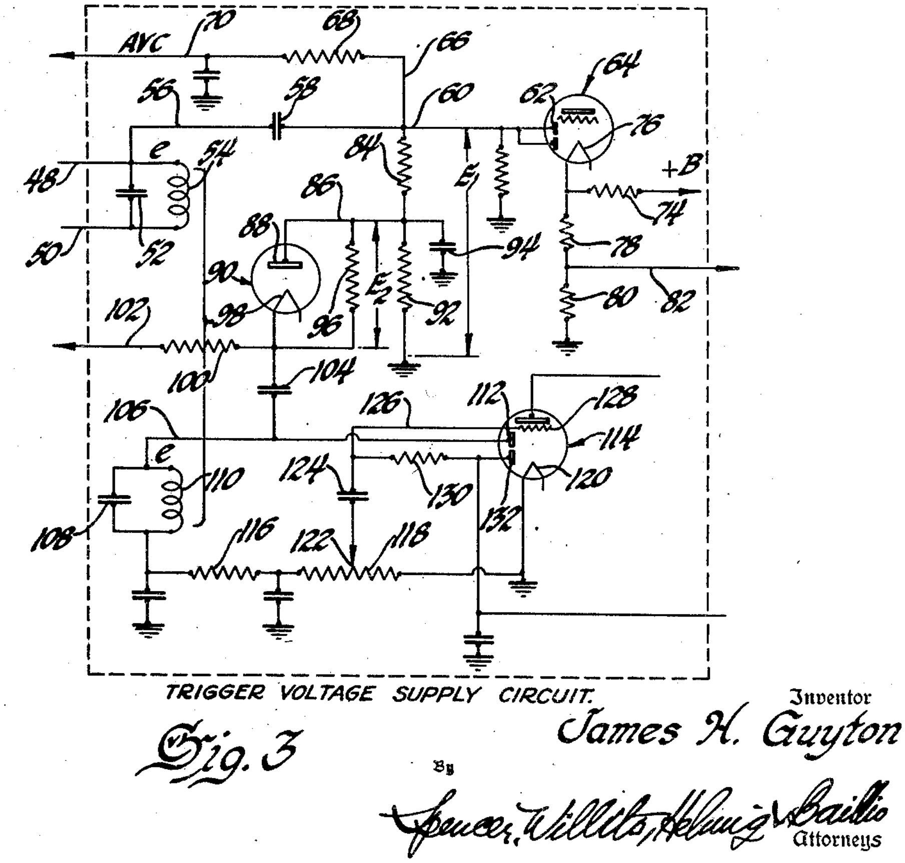
Figure 3 is a circuit diagram of a portion of a radio receiver which incorporates my invention.

Rather than incorporate or add to the ordinary radio receiver circuit any more additional radio parts than necessary, it is possible to pick off opposed signals and voltages to carry out the above basic idea without the addition of many parts. There is shown in Figure 3 a portion of the radio receiver circuit of conventional parts showing the additional connections necessary to incorporate my control system therein. In this figure the incoming lines 48 and 50 come from the I. F. stage and impress the incoming signal on the system. These lines are connected to a condenser 52 and a primary 54 of the I. F. coupling and line 56 connected thereto extends to condenser 58 and thence through line 60 to plate electrode 62 of the multi-element tube 64. Line 66 interconnects line 60 with resistor 68, the opposite terminal of which is connected through line 70 back to the initial stages of the receiver and provides the AVC voltage control. A resistor 74 is connected to the cathode 76 of the tube and extends to the +B voltage for the receiver. Two resistors 78 and 80 are connected in series between the cathode and ground and a conductive line 82 is connected at a point intermediate resistors 78 and 80 and forms one side of the control line on which the trigger voltage is developed.

A resistance 84 has one terminal connected to line 60 and the opposite terminal connected to a conductive line 86 which extends to one electrode 88 of a diode 90. A resistor 92 is connected between conductor 86 and ground and in like manner condenser 94 is connected between conductor 86 and ground. A resistor 96 is connected between line 86 and the second electrode 98 of the diode 90. A resistor 100 is connected to the electrode 98 and also to conductive line 102 which forms the second portion of the line on which the trigger voltage is deveolped. A condenser 104 interconnects electrode 98 of the diode 90 with conductor 106, which extends from a second tuned circuit incorporating condenser 108 and secondary coil 110 of the I. F. transformer with electrode 112 of a multi-element audio amplifier tube 114. Secondary coil 110 is the other half of the I. F. transformer and is in inductive relation with primary 54 receiving its signal therefrom.

Two resistors 116 and 118 in series are connected between the resonant circuit formed of condenser 108 and secondary 110 and cathode 120 of tube 114. A variable tap 122 on resistor 118 forms the normal volume control of the receiver and is connected through condenser 124 and line 126 with control grid 128 of the audio amplifier 114. A resistance 130 is interconnected between line 126 and a second electrode 132 of the tube 114. In this system the voltage corresponding to $E_1$ of Figure 2 is that developed across the two resistances 84 and 92 in series and is proportional to the AVC voltage of the receiver. The impressed A. C. voltage corresponding to $e$ is impressed across incoming lines 48 and 50 and, of course, proportionately across the secondary 110 by the primary 54. A voltage corresponding to $E_2$ of Figure 2 is developed across resistor 96 of Figure 3. The biasing voltage corresponding to V supplied by the battery of Figure 3 is supplied through resistor 74 to cathode 76 of tube 64.

In this case, therefore, the triggering voltage $E_t$ appears between line 102 and ground of Figure 3 and is equivalent to $E_2$ minus a portion of $E_1$ as determined by the voltage dividing action of resistors 92 and 84, shown on that figure. In this case, however, instead of the two voltages $E_1$ and $E_2$ being substantially equal, they will be of a different ratio depending upon the ratio of the turns between primary 54 and secondary 110. In the usual case this ratio is less than one and will, therefore, make it necessary to use only a portion of voltage $E_1$, which proportionality would be of the same ratio as the voltage ratio of the transformer primary and secondary. In this system, as shown in Figure 3, therefore, one of the voltages is taken off the AVC diode from the primary of the I. F. transformer and the other voltage is taken from the secondary of the I. F. transformer rectified in a diode rectifier and added to the first voltage in inverted phase, the resultant signal appearing between line 102 and ground, being of a value determined by the voltage bias developed by resistor 74 across resistors 78 and 80.

With the system as shown in Figure 2, the triggering voltage, therefore, is substantially uniform over a wide range of variation in the input signal from the earlier stages of the receiver and is a function only of the selectivity of the receiver ahead of the indicated I. F. stage. This, of course, is because the shape of the response curve at this point is determined by the selectivity of the receiver ahead. The shape of the curve of the triggering voltage may, if desired, be varied from that of a substantially constant voltage across the width of the response curve when there is no difference in selectivity between the two points where the voltages $E_1$ and $E_2$ originate, to a peaked signal or trigger voltage, the maximum value of which remains the same for all signal inputs, but which across the response curve may assume a broad or sharp peak, depending upon the input, as is desired by the designer. Thus, in Figure 3 the coupling between the two coils of the I. F. transformer may be designed to give a desired peak trigger curve, since the voltages which are combined originate on opposite sides thereof. This is best illustrated by reference to Figures 4 and 5 and their associated voltage curves *4a* and *4b* and *5a* and *5b*.

Figure 4 illustrates in simplified form a circuit in which the two voltages originate from the same point and, therefore, there is no difference in selectivity and Figure 5 is a simplified diagram wherein the voltages originate from different parts of the circuit giving a change in selectivity.

Referring now more specifically to Figure 4, there is shown therein a tuned circuit consisting of a capacity 134 and an inductance coil 136, which may be a part of any amplifier system. Conductor 138 extends from one side of this tuned circuit and is connected through condenser 145 to a resistor 140 and to one electrode 142 of a diode 144. Conductor 138 is also connected to a condenser 146. The second electrode 160 of diode 144 is connected through battery 162 to ground the positive side of the battery being connected to the electrode 160. The opposite side of the tuned circuit is connected through conductor 148 to ground and to a condenser 150. Between the condensers 146 and 150 there is connected a diode rectifier 152 whose electrode 154 is connected to condenser 146 and its second electrode 156 is connected to condenser 150. A resistance 158 is connected directly across the diode. The two diode load resistors 158 and 140 are connected together by resistor 157 as shown.

Assuming that an R. F. voltage $e$ similar to the voltages considered in the previous examples is present on line 138, then at the resonant frequency the response curve of this voltage will appear as shown at G, as in Figure *4a*. However, since the two diodes are connected in opposition, a voltage having its highest potential at the lower end of resistance 140 will be opposed by a voltage across resistance 158 having its highest potential at the top and in the same manner as that shown in Figure 2, the resultant response curve of D. C. voltages developed by the diodes vs. frequency at diode element 154 will be that shown in the heavy line indicated at H, which increases from zero to a definite preset value, and then is maintained constant to the other side of the resonant curve and decays to zero. This is due to the fact that the voltage rises across one diode to a certain value before the other diode conducts at all, and from that point on the remaining parts of the two curves I and J are directly out of phase and cancel. It will be evident that these cancelling portions must be of the same shape if they are to completely cancel each other out.

If there is any selectivity difference in the signals, then the resultant signal will not be a straight horizontal line or a constant voltage, but will vary depending upon the graphical addition of the two voltages. Such a situation is illustrated in Figure 5, where the two opposed voltage curves are dissimilar in selectivity with frequency, and in that case a resonant circuit consisting of a capacitor 164 and an inductance coil 166 is connected through a conductive line 168 and condenser 167 to electrode 170 of a diode 172, the opposite electrode 174 of which is connected through a battery 176 to ground the positive terminal of the battery being connected to the electrode 174. A resistor 178 is connected between electrode 170 and ground and has a control voltage developed there-across having its higher potential at the bottom end. A further conductor 180 connects condenser 167 through resistance 181 with a second tuned circuit consisting of inductance 182 and capacitance 184 and in this case inductance 182 is normally mounted in inductive relation with coil 166 and forms the other half of the coupling transformer. Resistance 181 also is connected to one terminal of a resistance 186, the other terminal of which is connected to a conductor 188 and which is in parallel with condenser 191 and thence to the equipment to be controlled.

One electrode 190 of diode rectifier 192 is connected to the resonant circuit consisting of inductance 182 and condenser 184 through line 194. The other element 196 of the diode rectifier 192 is directly connected to the conductor 188. The higher potential is developed across resistor 186 at the right hand side by the diode 192. It will be evident that in this case, due to the loose coupling between the coils 182 and 166, the frequency selectivity curve of voltage appearing across the tuned circuit 164—166 and that appearing in the tuned circuit 182—184 will not be identical, and this difference may be indicated by the two curves shown in Figure 5*a* which represent approximately critical coupling of the two tuned circuits. The outer curve K is the primary curve with a small downward depression at the peak and the secondary response curve or that appearing in tuned circuit 182—184 is that shown in the inner curve L. If we now invert one of these two curves, oppose the voltages across 186 and 178 and bias through the use of battery 176, curve K will be shown above the axis and L below, and if these two curves are now graphically added, the resultant central wavy curve M will be obtained.

This curve, it is noted, proceeds slightly below the axis and then slightly above, and next takes a deep dip down to point N, which is the equivalent of the bias voltage, the opposite side being a duplicate in the reverse of the initial. In this case the trigger voltage for the control pulse would be that supplied by the peaked downward portion extending down to N, and instead of a broad flat wave pulse, would be a shorter peaked one. In this case, if the input signal were increased, instead of the two sides merely stretching out and cancelling each other, as would have occurred in 4*b* to retain the same flat top pulse as shown therein, the center peak would become more pronounced, as shown by the remaining curve O, and would be comparable in shape to the curve obtained from a weak signal whose output would be about the same amplitude as N, but it is noted that the central sharp downwardly projecting tip does not extend any further below the axis, but is merely a more pointed and narrow control voltage than previously indicated. Thus, by varying the selectivity or coupling between the points at which the control voltages are taken, the shape of the control voltage to cause it to be more or less sharp peaked may be controlled. It is obvious, however, that its maximum value remains the same still, disregarding any change in the amplitude of the incoming signal.

I claim:

1. In electrical systems in which a control voltage of varying amplitude is developed on a conductive line, a pair of rectifiers of similar characteristics, each having an anode and a cathode, the anode of one rectifier being connected to the conductive line and the cathode of the other being so connected, biasing means connected in series with one of the rectifiers to prevent it from conducting until the voltage on the conductive line connected to that rectifier exceeds the biasing means, resistors of substantially equal value connected respectively, one across the series circuit of the one rectifier and biasing means, and the other across the other rectifier so that the voltages developed thereacross by current flow through the associated rectifier by a common signal on the conductive line will be equal above the biasing voltage, conductive means connecting the resistors serially so that the voltages developed thereacross are of opposed polarities, and output means connected to the resistors so that a voltage of constant amplitude will be provided on the output means by variable control voltages of any amplitude on the conductive input line that exceed the bias means.

2. In electrical systems in which a control voltage of varying amplitude is developed on a conductive line, a pair of rectifiers of similar characteristics, each having an anode and a cathode, the anode of one rectifier being connected to the conductive line and the cathode of the other being so connected, biasing means connected in series with one of the rectifiers to prevent it from conducting until the voltage on the conductive line connected to the rectifier exceeds the biasing means, resistors of substantially equal value connected respectively, one across the series circuit of the one rectifier and biasing means, and the other across the other rectifier so that the voltages developed thereacross by current flow through the associated rectifier by a common signal on the conductive line will be equal above the biasing voltage, conductive means for connecting the resistors serially so that the voltages developed thereacross are of opposed polarities, output means connected to the resistors so that a voltage of constant amplitude will be provided on the output means by variable control voltages of any amplitude on the conductive input line that exceed the bias means, and means having different frequency selectivity characteristics connected between the conductive input line and one of the rectifiers to provide different shaped pulses applied to each.

3. In radio receiving apparatus having a conductive line upon which an amplified input signal is produced, a first diode having an anode and a cathode electrode, one of which is connected to said line, voltage biasing means connected in series with the diode so that the same will not conduct until the voltage on the input line exceeds the biasing voltage, a first resistor connected across the diode and biasing voltage in series and across which a voltage is developed by the flow of current through said diode, a primary inductance coil connected to said conductive line, a secondary coil in inductive relation to the primary in which proportionate voltages are induced by the primary, a second diode having an anode and a cathode electrode, the alternative electrode to that of the first diode being connected to the secondary, a second resistor of substantially the same value as the first connected across the second diode and to an intermediate point in the first resistor so that voltages developed across the second resistor will be in opposed polarity series relation with a proportionate part of the first resistor, said proportion being determined by the voltage ratio of the primary and secondary coils, and an output circuit connected to the series resistance circuit.

4. In an electrical system in which a control voltage of varying amplitude is developed on a conductive line, a transformer having a primary and a secondary winding, said primary winding being connected to said conductive line, a first diode having an anode and a cathode electrode, one of said electrodes being connected to the conductive line, a second diode having an anode and a cathode electrode, the alternative electrode in the second diode being connected to the secondary, a first resistance connected across the first diode and developing a voltage thereacross when the diode conducts, said resistance having tap connections intermediate its end connections, the position of the tap being determined by the voltage ratio of the transformer, a second resistance connected across a second diode, means for connecting said second resistance to the tap in the first resistance so that the second resistance and a portion of the first resistance are in series with the voltages developed having opposed polarity, and an output circuit connected to the series resistances.

5. In radio receiving apparatus having an intermediate frequency transformer with a primary and secondary into which an input signal is fed, a diode rectifier having an anode and a cathode electrode, one of its electrodes being connected to the primary, a first resistor, a source of biasing voltage connected in series with said diode, said first resistor being connected across said diode and serially connected biasing voltage, a second diode having an anode and a cathode electrode, its alternative electrode with respect to the first diode being connected to said secondary, a second resistor of substantially the same value as the first across said diode, a tap on the first resistor connected to said second resistor so that the voltages developed across the second resistor and across a portion of the first resistor are of opposite polarity, said tap bearing a ratio to the total first resistor of substantially the same value as the voltage ratio of primary to secondary in the transformer, and an output circuit connected across the second diode on which a control pulse appears which will not exceed the value of a given proportion of the biasing voltage regardless of the strength of the input signal and whose shape is determined by the selectivity of the coupling system.

JAMES H. GUYTON.

References Cited in the file of this patent

UNITED STATES PATENTS

| Number | Name | Date |
|---|---|---|
| 2,129,029 | Roberts | Sept. 6, 1938 |
| 2,153,780 | Van Loon | Apr. 11, 1939 |
| 2,216,451 | Muller | Oct. 1, 1940 |